United States Patent
Feng et al.

(10) Patent No.: US 8,831,049 B2
(45) Date of Patent: Sep. 9, 2014

(54) TUNABLE OPTICAL SYSTEM WITH HYBRID INTEGRATED LASER

(75) Inventors: Ningning Feng, Arcadia, CA (US);
Xiaochen Sun, Pomona, CA (US);
Dawei Zheng, Irvine, CA (US)

(73) Assignee: Laxense Inc., Walnut, CA (US)

( * ) Notice: Subject to any disclaimer, the term of this patent is extended or adjusted under 35 U.S.C. 154(b) by 84 days.

(21) Appl. No.: 13/620,410

(22) Filed: Sep. 14, 2012

(65) Prior Publication Data

US 2014/0079082 A1 Mar. 20, 2014

(51) Int. Cl.
*H01S 3/10* (2006.01)
*H01S 3/081* (2006.01)
*H01L 33/48* (2010.01)

(52) U.S. Cl.
USPC .................................. 372/20; 372/93; 438/27

(58) Field of Classification Search
CPC ..... H01S 5/0203; H01S 5/0206; H01S 5/026; H01S 5/028; H01S 5/10; H01S 5/1003; H01S 5/1202; H01S 5/125; H01S 5/22
USPC ............... 372/20, 23, 97, 102, 93, 99; 438/27
See application file for complete search history.

(56) References Cited

U.S. PATENT DOCUMENTS

| | | | |
|---|---|---|---|
| 6,853,671 B2 | 2/2005 | Liu et al. | |
| 6,856,732 B2 | 2/2005 | Liu et al. | |
| 7,245,792 B2 | 7/2007 | Liu | |
| 7,505,490 B2 | 3/2009 | Romano et al. | |
| 7,701,985 B2 | 4/2010 | Webster et al. | |
| 2003/0021305 A1 | 1/2003 | Lundqvist | |
| 2006/0039652 A1 | 2/2006 | Li | |
| 2006/0120680 A1 | 6/2006 | Li | |
| 2006/0239612 A1* | 10/2006 | De Dobbelaere et al. | 385/37 |
| 2008/0298402 A1 | 12/2008 | Rossi et al. | |
| 2010/0091804 A1 | 4/2010 | Musio et al. | |
| 2010/0232458 A1 | 9/2010 | Kim et al. | |
| 2011/0085572 A1* | 4/2011 | Dallesasse et al. | 372/20 |
| 2012/0008650 A1 | 1/2012 | Poustie et al. | |
| 2012/0099611 A1 | 4/2012 | Kim et al. | |

* cited by examiner

Primary Examiner — Armando Rodriguez (74) Attorney, Agent, or Firm — Chen Yoshimura LLP (57) ABSTRACT

A tunable optical system with hybrid integrated semiconductor laser is provided. The optical system includes a silicon-on-insulator (SOI) substrate; a first optical waveguide tunable comb filter formed at the first side of the SOI substrate; a second optical waveguide tunable comb filter with detuned filter response formed at the first side of the SOI substrate; an etched laser pit at the first side of the SOI substrate; a plurality of spacers formed on the bottom surface of the laser pit near the plane of the first side of the SOI substrate; a plurality of bumping pads formed on the bottom surface of the laser pit near the plane of the first side of the SOI substrate; and a laser chip flip-chip bonded at the first side of the SOI substrate supported by the spacers. Heating sections may be provided on the filters to tune the filters.

22 Claims, 6 Drawing Sheets

TUNABLE OPTICAL SYSTEM WITH HYBRID INTEGRATED LASER

BACKGROUND OF THE INVENTION

1. Field of the Invention

The invention relates to a tunable optical system with hybrid integrated semiconductor laser. In particular, the invention relates to a hybrid integrated tunable laser module using silicon external cavity and silicon waveguide wavelength tuning structures.

2. Description of the Related Art

The ever increasing bandwidth demand resulting from the continuous pursuit of high bandwidth data communication, especially the recent effort in wavelength-division multiplexing (WDM) passive optical network (PON), has motivated the fiber optic communication technology into a new era. The next generation optic communication system has to have the capability of handling much higher data communication traffic. In addition to the performance requirement, low cost solution is highly desired to reduce the total network construction and reconfiguration cost. A direct way to extend the already saturated capacity of current fiber optic communication systems is to transmit multiple optical channels using one single channel fiber using the dense WDM (DWDM) technology.

A WDM optical communication system, particularly a WDM-PON, typically consists of WDM optical transmitters, receivers, and WDM filters. The WDM receiver includes multiple photodetectors (PDs) and a WDM de-multiplexing (DMUX) filter. Since PDs can operate in a wide spectrum range, no particular requirement is imposed on them when used in WDM systems. The WDM optical transmitter includes a series of light sources emitting at multiple wavelengths and a WDM multiplexing (MUX) filter. The commonly used MUX/DMUX filters include diffraction gratings, thin-film filters, arrayed waveguide gratings, and optical add/drop filters, etc. The key and most challenging component is the light source module, which employs a series of light sources operating at different wavelengths. In most cases, they are strictly required to operate at ITU (International Telecommunication Union) frequency grids. To manufacture, deploy and manage these lights sources with so many different operating wavelengths is very challenging and cost ineffective.

A low cost tunable laser module with a wide range of wavelength reconfigurability is of particular importance for WDM-PON systems. Tunable lasers widely used in traditional long-haul WDM optical communication systems include distributed feedback (DFB) lasers, sampled-grating distributed Bragg reflector (SG-DBR) lasers, and external cavity lasers (ECLs). DFB lasers usually tune wavelength through thermal effect. Their wavelength tuning range is limited to less than a few nanometers. SG-DBR lasers monolithically integrate multiple active/tuning sections in one III-V material based chip and tune wavelength through current injection. They use Vernier effect to expand the tunability of the laser and can have much wider wavelength tuning range. However, SG-DBR lasers may not be a suitable light source solution for WDM-PON applications due to high cost and complex process. ECLs have many variations depending on the chosen type of external cavities. The approaches to tune the lasing wavelength of an ECL include changing laser resonant cavity and using wavelength tuning mirrors. Direct change of laser resonant cavity sometimes is difficult and may introduce additional fabrication complexity and high cost. Wavelength tuning mirrors are commonly used in ECLs. However, in most cases, integrating these tunable mirrors with laser active chips and executing the tuning are very challenge tasks. The ECLs will be a suitable light source for WDM-PON applications if low cost solution of fabricating, packaging and tuning the external cavity can be achieved.

SUMMARY OF THE INVENTION

A tunable optical system is provided. An objective of the invention is to provide methods of forming low cost tunable optical system, particularly, a hybrid integrated tunable laser modules with wide wavelength tuning range. Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a tunable optical system which includes: a silicon on insulator (SOI) substrate having a first side; a first waveguide based wavelength selective tunable filter formed on the first side of the SOI substrate; a second waveguide based wavelength selective tunable filter formed on the first side of the SOI substrate; an etched laser pit formed in the first side of the SOI substrate; and a laser chip flip-chip bonded onto the first side of the SOI substrate and received in the laser pit, the laser chip being optically coupled to the first and second waveguide based wavelength selective tunable filters.

In one example. the first and second waveguide based wavelength selective tunable filters are first and second optical waveguide sampled-grating distributed Bragg reflector (SG-DBR) tunable filters. In another example, the first and second waveguide based wavelength selective tunable filters are first and second optical waveguide microring tunable filters. In a third example, the first waveguide based wavelength selective tunable filter is a first optical waveguide sampled-grating distributed Bragg reflector (SG-DBR) tunable filter and the second waveguide based wavelength selective tunable filter is a second optical waveguide etalon tunable filter.

In another aspect, the present invention provides a method for forming a tunable optical system, which includes: providing a silicon on insulator (SOI) substrate having a first side; forming a first waveguide based wavelength selective tunable filter on the first side of the SOI substrate; forming a second waveguide based wavelength selective tunable filter on the first side of the SOI substrate; etching a laser pit in the first side of the SOI substrate; and flip-chip bonding a laser chip onto the first side of the SOI substrate and located in the laser pit, the laser chip being optically coupled to the first and second waveguide based wavelength selective tunable filters.

It is to be understood that both the foregoing general description and the following detailed description are exemplary and explanatory and are intended to provide further explanation of the invention as claimed.

BRIEF DESCRIPTION OF THE DRAWINGS

FIG. 2 (a)-(e) illustrate schematic diagrams of various exemplary configurations of laser chip flip-chip bonded to silicon waveguide tunable filter chip according to embodiments of the present invention.

DETAILED DESCRIPTION OF THE PREFERRED EMBODIMENTS

The invention provides methods of forming a tunable optical system, in particular, a silicon hybrid integrated tunable laser module. According to an embodiment of the present invention, a silicon hybrid integrated tunable laser module includes two waveguide tunable filters fabricated on the SOI substrate, an etched laser pit for receiving flip-chip bonded laser chip, a plurality of spacers and bumping pads formed on the bottom surface of the laser pit to support, align and electrically connect the laser chip, and a laser chip flip-chip bonded on the SOI chip.

Figure 1A:
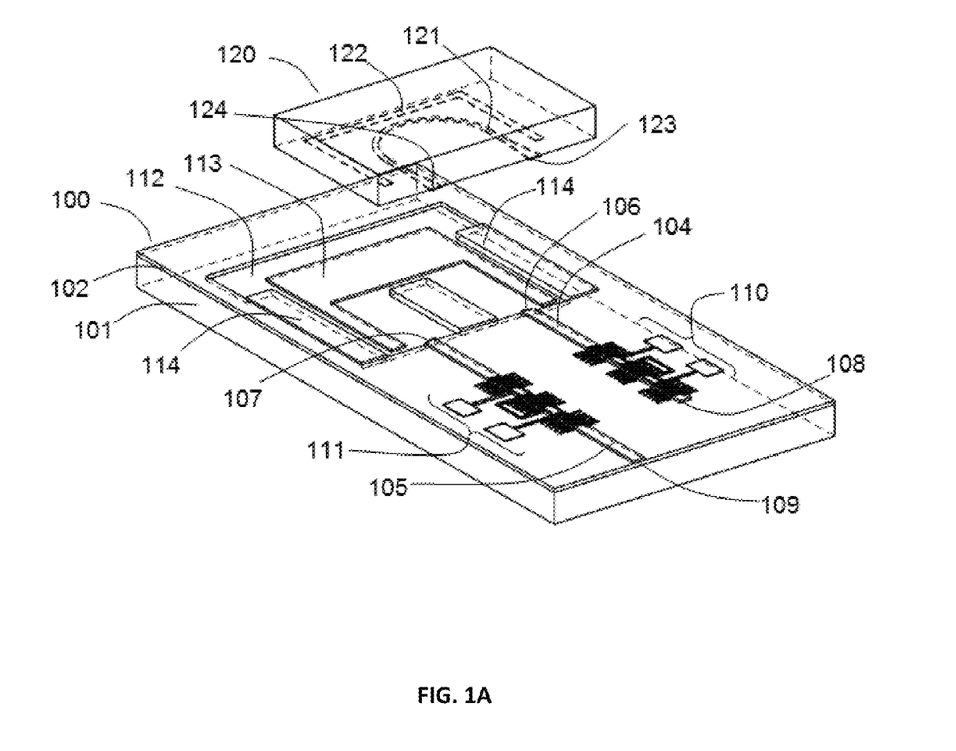
FIG. 1A is an exploded view of a silicon hybrid integrated tunable laser according to an embodiment of the present invention. The tunable laser module includes two silicon waveguide tunable SG-DBR filters, an etched laser pit, and a flip-chip bonded light source with a U-shaped active waveguide.
Figure 1B:
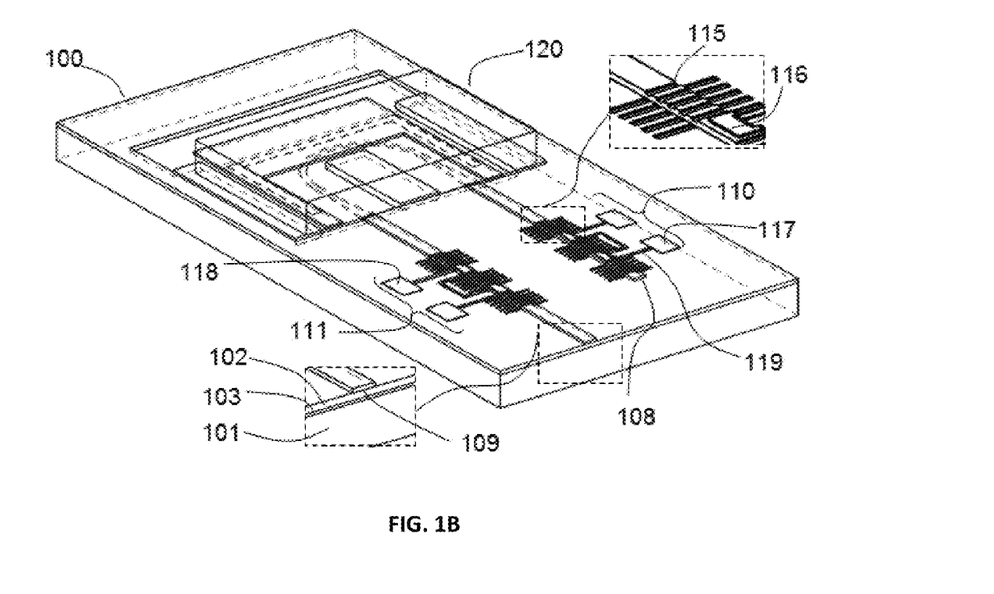
FIG. 1B is a perspective view of the silicon hybrid integrated tunable laser shown in FIG. 1A.
Figure 1C:
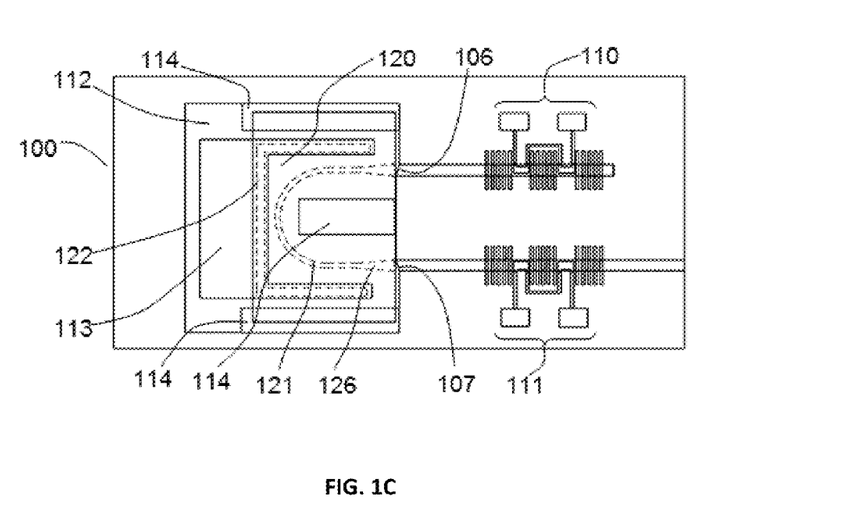
FIG. 1C is a top view of the silicon hybrid integrated tunable laser shown in FIG. 1A.
Figure 2A:
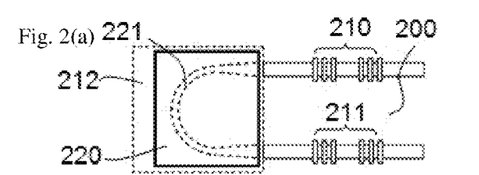
Figure 2B:
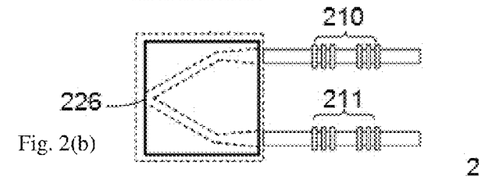
Figure 2C:
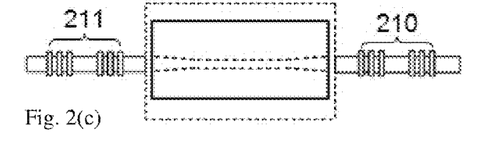
Figure 2D:
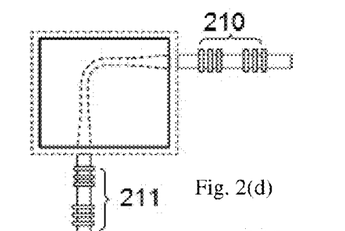
Figure 2E:
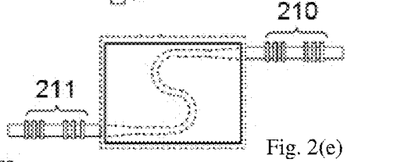

A silicon hybrid integrated tunable laser module according to an embodiment of the present invention is described with reference to FIGS. 1A-1C. FIG. 1A is an exploded view of the silicon hybrid integrated tunable laser module. FIG. 1B and FIG. 1C are the perspective view and top view of the assembled hybrid tunable laser. The components are drawn as if they were transparent. The tunable laser module includes a SOI substrate 100 and a flip-chip bonded laser chip 120. The SOI substrate 100 has a first (top) side and a second (bottom) side generally opposite to the first side, and includes a silicon substrate layer 101, a silica ($SiO_2$) isolation layer 103 and a top silicon device layer 102 in that order, with the silicon device layer being on the first side of the SOI substrate as shown in the low-left insert view of FIG. 1B. Two optical waveguides 104 and 105 are first formed at the first side of the SOI substrate 100 by etching. The end facets 106 and 107 of the waveguides near the laser pit 112 are fabricated with angles tilted from the plane perpendicular to the waveguide longitudinal directions to reduce back reflection from the facets into the laser chip 120. The end facets are coated with anti-reflection coatings (ARCs). The tilted angle is between 4°-30° depending on the return loss and coupling loss requirements. In the embodiment shown in FIGS. 1A-1C, the distal end 108 of the waveguide 104 is coated with high reflection film to reflect light back to the waveguide. In some cases, a small transmission in waveguide end 108 can be designed for power monitoring purpose. For the other end 109 of the waveguide 105, an ARC is applied to allow laser light to emit from this end.

Two tunable comb-filters 110 and 111 are formed on the first side of the SOI substrate. In this embodiment, two SG-DBR sections are etched on top of the waveguide ridges and slab regions of waveguides 104 and 105 shown as 115 in the top-right insert view of FIG. 1B. The pitches of the grating teeth determine the comb-filter's working wavelengths. The etching depth is related to the coupling strength between the "fast" and "slow" waves where the optical wave sees low and high refractive indexes. The comb-filter wavelengths can be set to be ITU grids if desired. If in a tunable laser structure where each end has a comb-like reflection characteristic, but where the two comb pitches are different, the laser tuning range can be expanded significantly by so called Vernier effect. Assuming the first SG-DBR tuning section 110 has reflective spectrum wavelength pitch $\Delta\lambda_1 = \Delta\lambda$ and the second tuning section 111 has reflective spectrum pitch $\Delta\lambda_2 = \Delta\lambda - \delta\lambda$, the maximum tuning range of the laser is the least common multiple of $\Delta\lambda_1$ and $\Delta\lambda_2$ according to the theory. The laser will lase at the coincident wavelengths of the two filters' reflective spectra. By shifting and manipulating the comb-wavelength positions of the two filter's reflective spectra, the laser's tuning range can be expanded to a few tens of nanometers.

Each filter has its center wavelength and filter characteristics. To tune the filters' reflective spectra, two approaches can be applied, including current injection and thermal tuning. The current injection approach is commonly used in SG-DBR tunable lasers because it can be monolithically integrated with other laser structures. However, free carrier induced optical absorption degrades the laser performance. Sometimes an optical amplifier is required to be integrated with the laser, which increases the fabrication complexity. Thermal tuning does not introduce additional loss and is commonly used in DFB lasers for small range wavelength tuning. Thermal tuning becomes a very attractive approach when Vernier effect is used. Since silicon has a much larger thermal coefficient than silica, silicon based tunable external cavity is much more efficient than the optical fiber based external cavity. To realize thermal tuning, a plurality of heater sections 116 made of metals, such as aluminum, titanium, and nickel, or implanted semiconductors, such as silicon, are fabricated on top of the waveguide ridges and slab regions of tunable filter 110. An aluminum metal trace 119 connects metal contact pads 117 (or 118 for the other tunable filter 111) with the heater sections 116. When operating, an electrical current is applied to the metal pads 117 and 118 of each tunable filter 110 and 111. The heater generates local heat to heat up the silicon waveguide whose refractive index is a function of temperature. Waveguide refractive index change induces the filter spectrum shift.

The hybrid tunable laser module further includes an etched laser pit 112 formed by etching at the first side of the SOI substrate 100. The depth of the laser pit ranges from a few micrometers to tens of micrometers determined by the distance between the laser waveguide's mode center to the laser's top surface. A plurality of spacers 114 are formed as ridges extending from the bottom of the laser pit 112 or the top surface of the SOI substrate 100. The spacers may be made of metals, silicon or other materials compatible with the fabrication process. The spacers 114 provide mechanical support and precise vertical height control and horizontal position for the flipped light source 120. The light source 120 can be, but is not limited to, a distributed feedback (DFB) laser, a Fabry-Perot (FP) laser or other types of edge-emitting lasers. The working wavelength of the light source 120 can be, but is not limited to, 633 nm, 850 nm, 980 nm, 1064 nm, 1310 nm, 1490 nm, 1550 nm. The height of the spacers 114 is adjusted such that the highest feature on the top surface of the laser chip 120 does not touch the bottom surface of the etched laser pit 112 and the contact pads 122 of the light source chip can be securely contacted with the pre-fabricated contact metal bumping pads 113 on the bottom surface of the laser pit 112 to provide electrical connection. The height of the spacers typically is, but is not limited to, between 1 μm to 20 μm.

The laser chip 120 has a special designed U-shaped active waveguide 121 made of gain materials to accommodate the requirement of hybrid flip-chip bonding to the pre-fabricated silicon substrate 100. The laser waveguide may include mode transformers 126 which convert the laser mode to the silicon waveguide mode to reduce the coupling loss between laser waveguide 121 and silicon waveguides 104 and 105. The laser waveguide's end facets 123 and 124 usually are formed by cleaving and are perpendicular to the waveguide's longitudinal direction. The facets 123 and 124 may be coated with ARC to reduce back reflection. Vertical and horizontal alignments between the laser waveguide 121 and the silicon waveguides 104 and 105 are realized by controlling the height and position of the spacers 114. The tunable filters 110 and 111 and silicon optical waveguides 104 and 105 together form the silicon based external cavity. The silicon based SG-DBR tunable filters 110 and 111, together with the active waveguide 121 in the laser chip 120, form a silicon hybrid external cavity tunable laser module.

FIG. 2. (a)-(e) illustrate schematic diagrams of various exemplary configurations of laser chip 220 flip-chip bonded inside the etched laser pit 212 on the silicon waveguide tunable filter chip 200. In addition to the configuration illustrated in FIG. 1 (and in FIG. 2. (a)), where a laser chip with a U-shaped active waveguide design, other possible designs of interface between a laser chip 220 and a silicon waveguide chip 200 can be, but not limited to, a laser chip with a V-shaped active waveguide with a total reflection facet 226 and parallel silicon waveguide tunable filters 210 and 211 (see FIG. 2(b)); a laser chip with a straight active waveguide arrangement (see FIG. 2(c)); a laser chip with quarter circle active waveguide and perpendicular silicon waveguide arrangement (see FIG. 2(d)); and a laser chip with an S-shaped active waveguide arrangement (see FIG. 2(e)). Other combinations are also possible but not shown in FIGS. 2(a)-2(e).

Figure 3A:
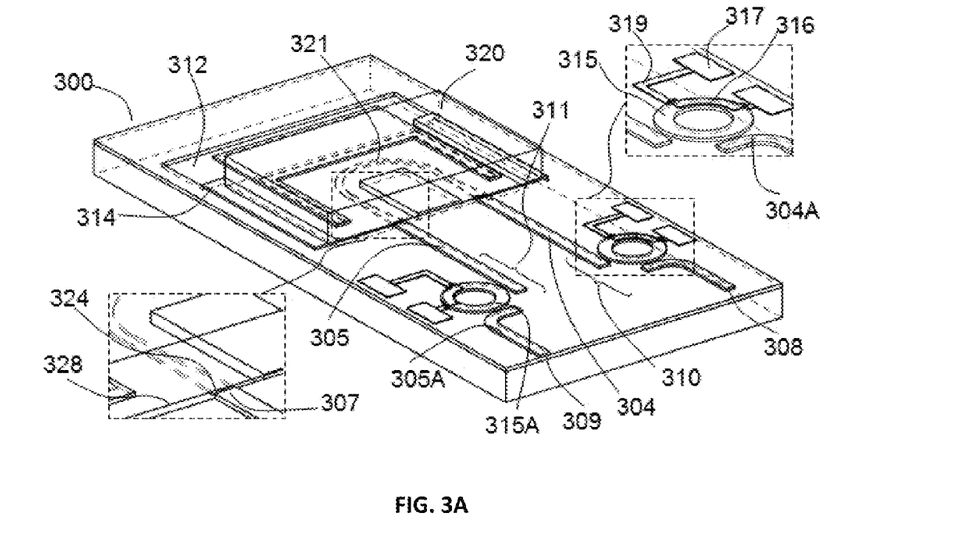
FIG. 3A is a perspective view of a silicon hybrid integrated tunable laser according to another embodiment of the present invention. The tunable laser module includes two silicon waveguide tunable microring filters, an etched laser pit, and a flip-chip bonded light source with a U-shaped active waveguide.
Figure 3B:
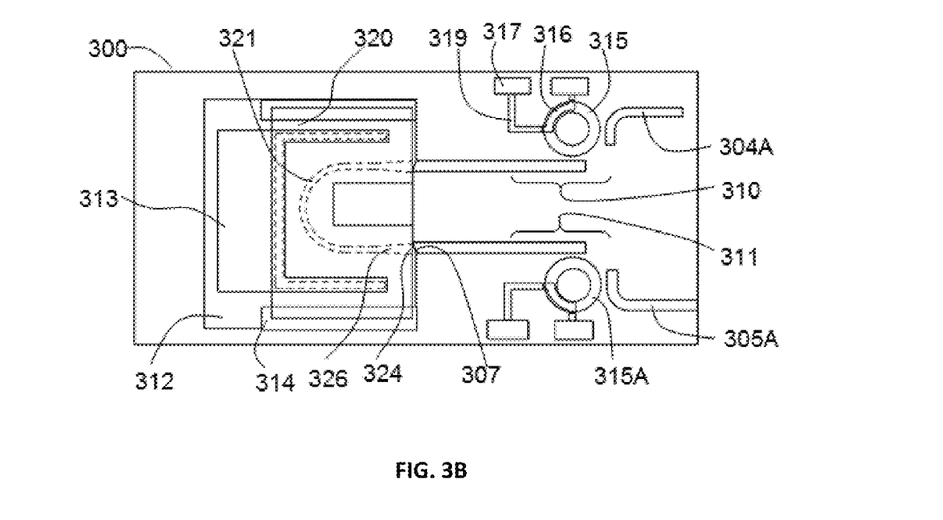
FIG. 3B is a top view of the silicon hybrid integrated tunable laser shown in FIG. 3A.

FIG. 3A and FIG. 3B are the perspective view and top view, respectively, of a silicon hybrid integrated tunable laser according to another embodiment of the present invention. An SOI chip 300 includes two optical waveguide tunable filters 310 and 311, an etched laser pit 312 with a plurality of spacers 314 and metal bumping pads 313. In this embodiment, the tunable filters are based on silicon microring resonators. The microring resonator tunable filter 310 includes a silicon microring structure 315, and two silicon waveguides 304 and 304A acting respectively as an input port and a drop port of the microring resonator system. The silicon microring based tunable filters 310 and 311, together with the connecting waveguides 304 and 305, form the tunable external cavity. The diameter of the microring ranges from a few to hundreds of micrometers depending on the free spectral range (FSR) requirement of the filter response. The two waveguides 304 and 304A are located in the proximity of the microring 315. The distances between the input/drop port waveguides and the microring 315 are in the range of a fraction of micrometer to a few micrometers determined by the coupling strength requirement of the filter. The closer the distance, the stronger the coupling between waveguide and microring. The coupling strength also affects the quality factor of the microring resonator. Although not shown in the figures, a tuning section may be needed to fine tune the microring coupling strength in order to reach the so called "critical coupling" condition by tuning the splitting ratio in the coupling regions. To tune the filter spectrum of the microring resonator, a heater 316 made of metals or semiconductors is disposed on top of the microring structure 315. The heater is connected to metal contact pads 317 by a metal trace 319. When an electrical current is applied, the heater heats up the local waveguide of the microring and makes the resonant peaks of the filter shift towards longer wavelengths. The other sets of waveguides 305 and 305A together with the microring structure 315A with a different diameter forms the second microring tunable filter 311. The distal end 308 of the optical waveguide 304A is coated with high reflection film to reflect light back to the waveguide 304A. In some cases, a small transmission in the waveguide end 308 can be designed for power monitoring purpose. For the distal end 309 of the waveguide 305A, an ARC layer is applied to allow laser light to emit from this end.

Similar to the embodiment in FIGS. 1A-1C, an etched laser pit 312 is formed by etching on the top surface of the SOI substrate 300 to allow a laser chip 320 to be flip-chip bonded on the substrate 300. A plurality of spacers 314 are formed as ridges extending from the bottom of the laser pit or from the top surface of the SOI substrate 300 to provide mechanical support and precise vertical height and horizontal alignment for the flipped light source 320.

The laser chip 320 is flip-chip bonded into the pre-fabricated laser pit 312 on the silicon substrate 300. The laser waveguide may include mode transformers 326 which convert the laser mode to the silicon waveguide mode to reduce the coupling loss between the laser waveguide 321 and the silicon waveguides 304 and 305. The laser chip's edge surface 328 is coated with an ARC layer to reduce back reflection. In addition to providing mechanical support, the spacers 314 are also used as vertical height controller and alignment marks for in-plane alignment to make sure the facets 324 and 307 of the laser and the silicon waveguide are perfectly aligned with each other.

Figure 4A:
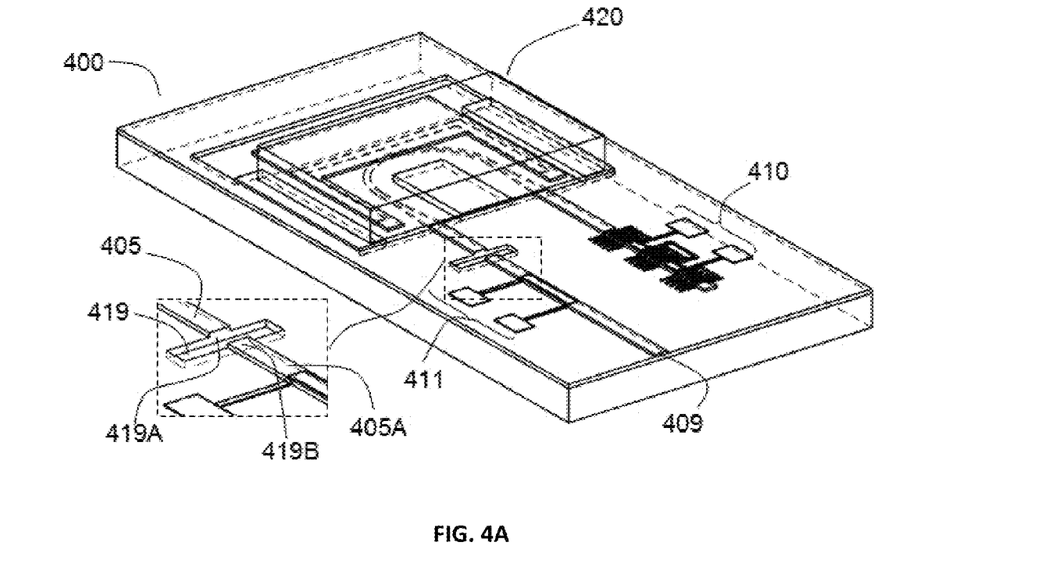
FIG. 4A is a perspective view of a silicon hybrid integrated tunable laser according to another embodiment of the present invention. The tunable laser module includes a silicon waveguide tunable SG-DBR filter, a silicon waveguide tunable etalon filter formed by deep-etched trench, an etched laser pit, and a flip-chip bonded light source with a U-shaped active waveguide.
Figure 4B:
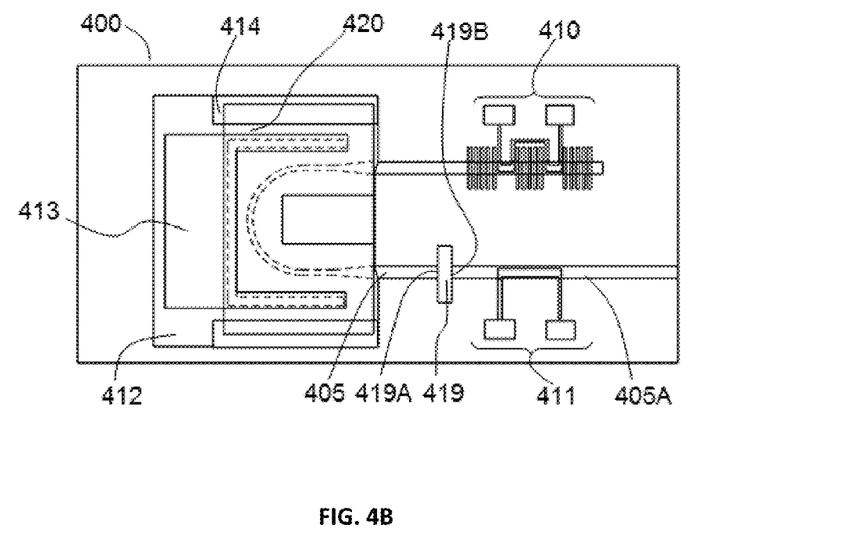
FIG. 4B is a top view of the silicon hybrid integrated tunable laser shown in FIG. 4A.

FIG. 4A and FIG. 4B illustrate perspective and top views of a silicon hybrid integrated tunable laser according to another embodiment of the present invention. Similar to the embodiments described in FIGS. 1A-1C and FIGS. 3A-3B, the tunable laser module of FIGS. 4A-4B includes a pre-fabricated SOI substrate 400, an etched laser pit 412 with associated structures such as a plurality of spacers 414 and metal bumping pads 413, two optical waveguide tunable filters 410 and 411 fabricated on the SOI substrate, and a laser chip 420 flip-chip bonded to the SOI substrate 400. Different from the other embodiments, one of the tunable filters 410 uses a SG-DBR and the other tunable filter 411 is realized by an optical waveguide etalon filter. The waveguide etalon filter 411 includes two end-reflectors 419B and 409. In this embodiment, one of the waveguide reflectors 419B is formed by a deep-etched trench 419. The other reflector can use the waveguide end 409 of waveguide 405A or use another deep-etched trench (not shown in the figure). To achieve desired filter response, the two ends 419B and 409 of the waveguide etalon filter 411 are coated with thin films that provide designed reflective characteristics. The other facet 419A at the other side of the trench 419 is coated with ARC films to reduce back reflection into input waveguide 405. The etalon filter response can be tuned through a waveguide tuning section 411 with build-in heater.

Figure 5A:
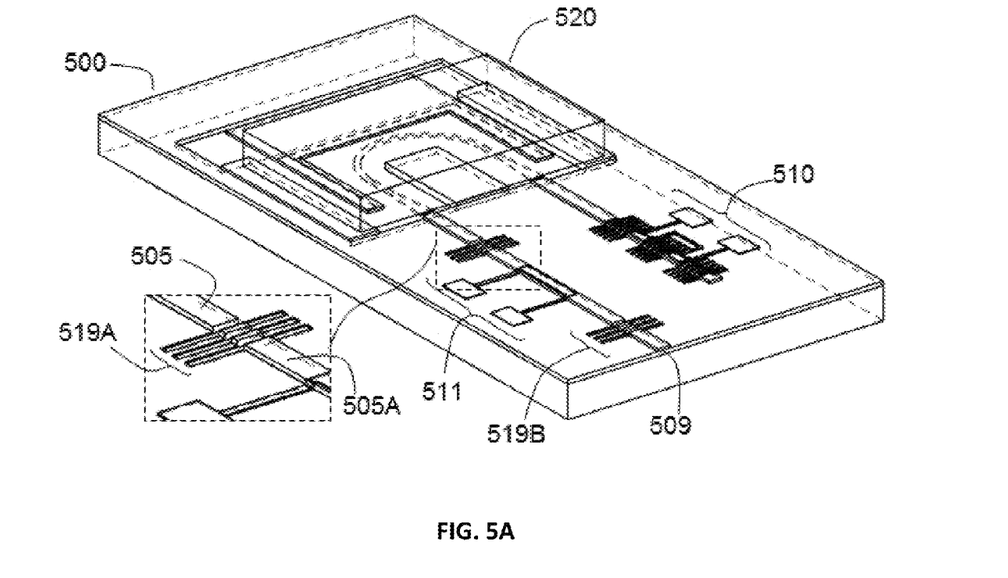
FIG. 5A is a perspective view of a silicon hybrid integrated tunable laser according to another embodiment of the present invention. The tunable laser module includes a silicon waveguide tunable SG-DBR filter, a silicon waveguide tunable etalon filter formed by deep-etched gratings, an etched laser pit, and a flip-chip bonded light source with a U-shaped active waveguide.
Figure 5B:
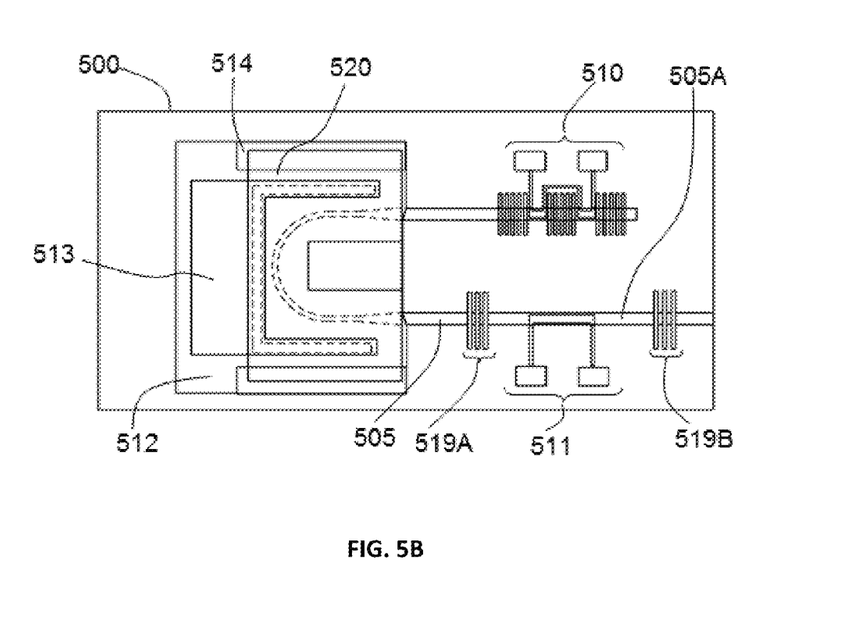
FIG. 5B is a top view of the silicon hybrid integrated tunable laser shown in FIG. 5A.

FIG. 5A and FIG. 5B illustrate perspective and top views of a silicon hybrid integrated tunable laser according to another embodiment of the present invention. The structure shown in FIGS. 5A-5B is a variation of the one shown in FIGS. 4A-4B. Similar to the other embodiments, the tunable laser module includes a pre-fabricated SOI substrate 500, an etched laser pit 512 with associated structures such as a plurality of spacers 514 and metal bumping pads 513, two optical waveguide tunable filters 510 and 511 fabricated on the SOI substrate, and a laser chip 520 flip-chip bonded to the SOI substrate 500. Different from the embodiment in FIGS. 4A-4B, the waveguide etalon filter 511 is realized by two sections of deep-etched waveguide gratings 519A and 519B fabricated on the waveguide 505. The etalon filter response can be tuned by heating up a portion 505A of the waveguide 505 between the waveguide gratings 519A and 519B.

In the above embodiments, the optical waveguide SG-DBR tunable filters, the optical waveguide microring resonator tunable filters, and the optical waveguide etalon tunable filter may be more generally referred to as waveguide based wavelength selective tunable filter. In addition to the ones described above, other types of waveguide based wavelength selective tunable filter may be used in the silicon hybrid integrated tunable laser.

It will be apparent to those skilled in the art that various modification and variations can be made in the optical system and related fabrication methods of the present invention without departing from the spirit or scope of the invention. Thus, it is intended that the present invention cover modifications and variations that come within the scope of the appended claims and their equivalents.

What is claimed is:

1. A tunable optical system comprising:
   a silicon on insulator (SOI) substrate having a first side;
   a first waveguide based wavelength selective tunable filter formed on the first side of the SOI substrate;
   a second waveguide based wavelength selective tunable filter formed on the first side of the SOI substrate;
   an etched laser pit formed in the first side of the SOI substrate; and
   a laser chip flip-chip bonded onto the first side of the SOI substrate and received in the laser pit, the laser chip having an active waveguide made of gain materials, wherein two opposite ends of the active waveguide are optically coupled to the first and second waveguide based wavelength selective tunable filters, respectively.

2. The tunable optical system of claim 1, wherein the SOI substrate comprising:
   a silicon substrate layer;
   a buried oxide (BOX) isolation layer on top of the silicon substrate layer; and
   a silicon device layer on top of the BOX layer, the silicon device layer forming the first side of the SOI substrate.

3. The tunable optical system of claim 1, wherein the first and second waveguide based wavelength selective tunable filters are first and second optical waveguide sampled-grating distributed Bragg reflector (SG-DBR) tunable filters.

4. The tunable optical system of claim 3, wherein the first SG-DBR tunable filter comprises:
   a first optical waveguide disposed on the first side of the SOI substrate;
   a first plurality of SG-DBR gratings disposed on a ridge of the first optical waveguide and on the first side of the SOI substrate to form a first waveguide reflector, wherein the first waveguide reflector has a designed center wavelength and filter characteristics;
   a first plurality of heaters disposed on the ridge of the first optical waveguide and on the first side of the SOI substrate including the first waveguide reflector, wherein the center wavelength of the waveguide reflector is dependent on a local temperature change of the first optical waveguide including the first waveguide reflector;
   a first plurality of metal pads disposed on the first side of the SOI substrate to electrically connect to an external electrical current source; and
   a first plurality of metal traces disposed at the first side of the SOI substrate to electrically connect the first plurality of heaters and the first plurality of metal pads.

5. The tunable optical system of claim 3, wherein the second SG-DBR tunable filter comprises:
   a second optical waveguide disposed on the first side of the SOI substrate;
   a second plurality of SG-DBR gratings disposed on a ridge of the second optical waveguide and on the first side of the SOI substrate to form a second waveguide reflector, wherein the second waveguide reflector has a filter characteristic with center wavelength detuning from the first tunable filter;
   a second plurality of heaters disposed on the ridge of the second optical waveguide and the first side of the SOI substrate including the second waveguide reflector;
   a second plurality of metal pads disposed on the first side of the SOI substrate to electrically connect the external electrical current source; and
   a second plurality of metal traces disposed at the first side of the SOI substrate to electrically connect the second plurality of heaters and the second plurality of metal pads.

6. The tunable optical system of claim 4, wherein the first optical waveguide has a ridge cross-section.

7. The tunable optical system of claim 6, wherein the first optical waveguide further has a first angled facet near the etched laser pit, wherein a second facet located away from the laser pit is coated with thin films with predefined reflectivity.

8. The tunable optical system of claim 5, wherein the second optical waveguide has a ridge cross-section.

9. The tunable optical system of claim 8, wherein the second optical waveguide further has a first angled facet near the etched laser pit, wherein a second facet at a far end from the laser pit is coated with thin films with predetermined reflectivity.

10. The optical system of claim 1, wherein the etched laser pit has a rectangular cross section in a plane perpendicular to a longitudinal line of the substrate.

11. The tunable optical system of claim 10, wherein the laser pit further comprises:
    a pit formed at the first side of the SOI substrate through etching;
    a plurality of spacers disposed on a bottom surface of the laser pit; and
    a plurality of metal bumping pads and metal traces disposed on the bottom surface of the laser pit to receive and electrical connect metals bumping pads of the laser chip.

12. The tunable optical system of claim 1, wherein the laser chip comprises:

an active waveguide made of a gain medium; and
a plurality of metal bumping pads to bond onto metal bumping pads on the laser pit of the SOI substrate to electrically bias the laser chip.

13. The tunable optical system of claim 12, wherein the active waveguide further comprises a mode transformer that converts laser mode to silicon waveguide mode.

14. The tunable optical system of claim 12, wherein the active waveguide has a U-shape, V-shape, straight line shape, quarter circle shape or S-shape.

15. The tunable optical system of claim 1, wherein the first and second waveguide based wavelength selective tunable filters are first and second optical waveguide microring tunable filters.

16. The tunable optical system of claim 15, wherein the first microring tunable filter comprises:
a first optical waveguide disposed on the first side of the SOI substrate;
a first microring structure disposed on the first side of the SOI substrate proximate to the first optical waveguide, wherein the microring has a diameter determined by designed resonant wavelengths;
a second optical waveguide disposed on the first side of the SOI substrate proximate to the first microring structure at a location other than the first optical waveguide, acting as a drop port of a microring resonator formed by the first optical waveguide, the first microring and the second optical waveguide;
a first heater section disposed on at least a part of the first microring structure, wherein the microring resonant wavelength of the first microring structure is responsive to a local temperature change of the part of the first microring structure;
a first plurality of metal pads disposed on the first side of the SOI substrate to electrically connect to an external electrical current source; and
a first plurality of metal traces disposed on the first side of the SOI substrate to electrically connect the first heater section and the first plurality of metal pads.

17. The tunable optical system of claim 16, wherein the second microring tunable filter comprises:
a third optical waveguide disposed on the first side of the SOI substrate;
a second microring structure with a different diameter from the diameter of the first microring structure disposed at the first side of the SOI substrate proximate to the first waveguide;
a fourth optical waveguide disposed at the first side of the SOI substrate proximate to the second microring at a location other than the third waveguide;
a second heater section disposed on at least a part of the second microring structure, wherein the microring resonant wavelength of the second microring structure is responsive to a local temperature change of the part of the second microring structure;
a second plurality of metal pads disposed on the first side of the SOI substrate to electrically connect to an external electrical current source; and
a second plurality of metal traces disposed at the first side of the SOI substrate to electrically connect the second heater section and the second plurality of metal pads.

18. The tunable optical system of claim 1, wherein the first waveguide based wavelength selective tunable filter is a first optical waveguide sampled-grating distributed Bragg reflector (SG-DBR) tunable filter and the second waveguide based wavelength selective tunable filter is a second optical waveguide etalon tunable filter.

19. The tunable optical system of claim 18, wherein the first SG-DBR tunable filter comprises:
a first optical waveguide disposed on the first side of the SOI substrate;
a first plurality of SG-DBR gratings disposed on a ridge of the first optical waveguide and the first side of the SOI substrate to form a first SG-DBR reflector;
a first plurality of heaters disposed on the ridge of the first optical waveguide and the first side of the SOI substrate including the first SG-DBR reflector;
a first plurality of metal pads disposed on the first side of the SOI substrate to electrically connect to an external electrical current source; and
a first plurality of metal traces disposed at the first side of the SOI substrate to electrically connect the first plurality of heaters and the first plurality of metal pads.

20. The tunable optical system of claim 18, wherein the second optical waveguide etalon tunable filter comprises:
a second optical waveguide disposed on the first side of the SOI substrate;
an optical waveguide etalon filter formed by deep-etched trench on the second optical waveguide;
a second heater section disposed on the at least a part of the optical waveguide etalon filter;
a second plurality of metal pads disposed on the first side of the SOI substrate to electrically connect to an external electrical current source; and
a second plurality of metal traces disposed at the first side of the SOI substrate to electrically connect the first plurality of heaters and the first plurality of metal pads.

21. The tunable optical system of claim 20, wherein the second optical waveguide etalon filter is formed by a first plurality of deep-etched waveguide grating and a second plurality of deep-etched waveguide grating formed on two end of the second optical waveguide.

22. A method for forming a tunable optical system, comprising:
providing a silicon on insulator (SOI) substrate having a first side;
forming a first waveguide based wavelength selective tunable filter on the first side of the SOI substrate;
forming a second waveguide based wavelength selective tunable filter on the first side of the SOI substrate;
etching a laser pit in the first side of the SOI substrate; and
flip-chip bonding a laser chip onto the first side of the SOI substrate and located in the laser pit, the laser chip having an active waveguide made of gain materials, wherein two opposite ends of the active waveguide are optically coupled to the first and second waveguide based wavelength selective tunable filters, respectively.

* * * * *